(12) United States Patent
Zhou et al.

(10) Patent No.: US 8,075,327 B2
(45) Date of Patent: Dec. 13, 2011

(54) GRID ARRAY CONNECTOR WITH FLOATING COVER

(75) Inventors: Yang Zhou, ShenZhen (CN); Hui Ye, ShenZhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 241 days.

(21) Appl. No.: 12/381,518

(22) Filed: Mar. 11, 2009

(65) Prior Publication Data

US 2009/0233474 A1  Sep. 17, 2009

(30) Foreign Application Priority Data

Mar. 11, 2008 (CN) ...................... 2008 2 0033266 U

(51) Int. Cl.
*H01R 13/64* (2006.01)

(52) U.S. Cl. ...................................................... 439/248

(58) Field of Classification Search .................. 439/248, 439/331, 342, 73
See application file for complete search history.

(56) References Cited

U.S. PATENT DOCUMENTS

| | | | |
|---|---|---|---|
| 6,431,899 B1 * | 8/2002 | Keller | 439/342 |
| 6,749,441 B1 | 6/2004 | Ma | |
| 7,001,197 B2 | 2/2006 | Shirai et al. | |
| 2006/0286827 A1 * | 12/2006 | Lai | 439/71 |

* cited by examiner

*Primary Examiner* — Vanessa Girardi
(74) *Attorney, Agent, or Firm* — Wei Te Chung; Andrew C. Cheng; Ming Chieh Chang

(57) ABSTRACT

An electrical connector assembly includes an insulative housing, a number of contacts, a fastening mechanism, and a floating cover. The contacts are received in the insulative housing and have mating portions extending of the insulative housing. The fastening mechanism includes a stiffener with a planar frame surrounding the insulative housing. The floating cover is provided with a number of openings to receive the mating portions of the contacts. The floating cover has a number of spring elements so as to floatably mount to the insulative housing and the stiffener.

19 Claims, 9 Drawing Sheets

GRID ARRAY CONNECTOR WITH FLOATING COVER

BACKGROUND OF THE INVENTION

1. Field of the invention

The present invention relates to an electrical connector assembly, and more particularly to an electrical connector assembly having a floating cover for protecting contacts from being damaged during assembled to the electrical connector assembly.

2. Description of the prior art

U.S. Pat. No. 7,001,197 issued to Shirai on Feb. 21, 2006 discloses an electrical connector comprising an insulative housing having a plurality of contacts. The insulative housing has a top surface for receiving an electronic package. A cover is pivotally mounted on a first end of the insulative housing. The cover is pivotal between an open position and a closed position and the cover presses the electronic package toward the top surface of the insulative housing at the closed position so that the electronic package electrically connects to the contacts. A lever is pivotally mounted to a second end of the insulative housing. The lever has a locking portion for locking the cover in the closed position. A stiffener is positioned on a bottom surface of the housing. The stiffener extends between the first end and the second end of the insulative housing. While the electrical connector is put to use, the electronic package presses on top end of the contacts to establish electrical connection between the contacts and the electronic package. However, because the top end of the contact is beyond the top surface of the insulative housing, the contacts will be bended or damaged by factors such as rough handing or accidental impact, which will weaken, even destroy, the electrical connection between the electronic package and the electrical connector.

U.S. Pat. No. 6,749,441 issued to Ma on Jun. 15, 2004 discloses an electrical connector. The electrical connector includes an insulative housing defining a first surface and a second surface, a plurality of contacts received in the housing, a cover slidably mounted to the housing and a spring positioned between the housing and the cover. The housing defines a plurality of restricting slots having a first protruding portion and a second protruding portion. The cover defines a plurality of openings and a plurality of hooks cooperating with the corresponding restricting slots of the housing. When the cover is at a first position where the hooks cooperate with the first protruding portions, the contact is between the upper surface of the cover and the first surface of the housing, when the cover is at a second position where the hooks cooperate with second protruding portion, the contact is protruded from the opening of the cover and bended front forward. However, because the contacts are protruded from the opening of the cover and bended front forward, the contacts will be interference with the opening when the contact is beyond the opening too long.

SUMMARY OF THE INVENTION

Accordingly, an object of the present invention is to provide an electrical connector assembly with a floating cover can floating on the electrical connector assembly to protect the contacts from damage and wiping.

In order to achieve the object set forth, an electrical connector assembly comprises an insulative housing, a plurality of contacts, a fastening mechanism surrounding the insulative housing, and a floating cover arranged on the fastening mechanism. The contacts receive in the insulative housing and each has a mating portion projecting out of the insulative housing and extending along a contact wiping direction. The floating cover is arranged on the fastening mechanism and moves along an up to down direction. The floating cover defines a plurality of openings corresponding to the contacts and has a guiding surface so as to the floating cover sliding along the contact wiping direction.

In order to further achieve the object set forth, an electrical connector assembly for use with an electronic package, comprises an insulative housing, a plurality of contacts received in the insulative housing, a stiffener including a planar frame surrounding the insulative housing, and a floating cover moveably seated on the stiffener. The insulative housing includes a base and a plurality of sidewalls extending upwardly from the peripheral of the base. Each contact has a mating portion extending beyond top surface of the base. The floating cover defines a plurality of openings for receiving the mating portions of the contacts. The floating cover synchronously moves in a vertical direction and a horizontal direction relative to the insulative housing from a first position to a second position.

DESCRIPTION OF PREFERRED EMBODIMENT

Reference will now be made to the drawings to describe the present invention in detail.

Figure 1:
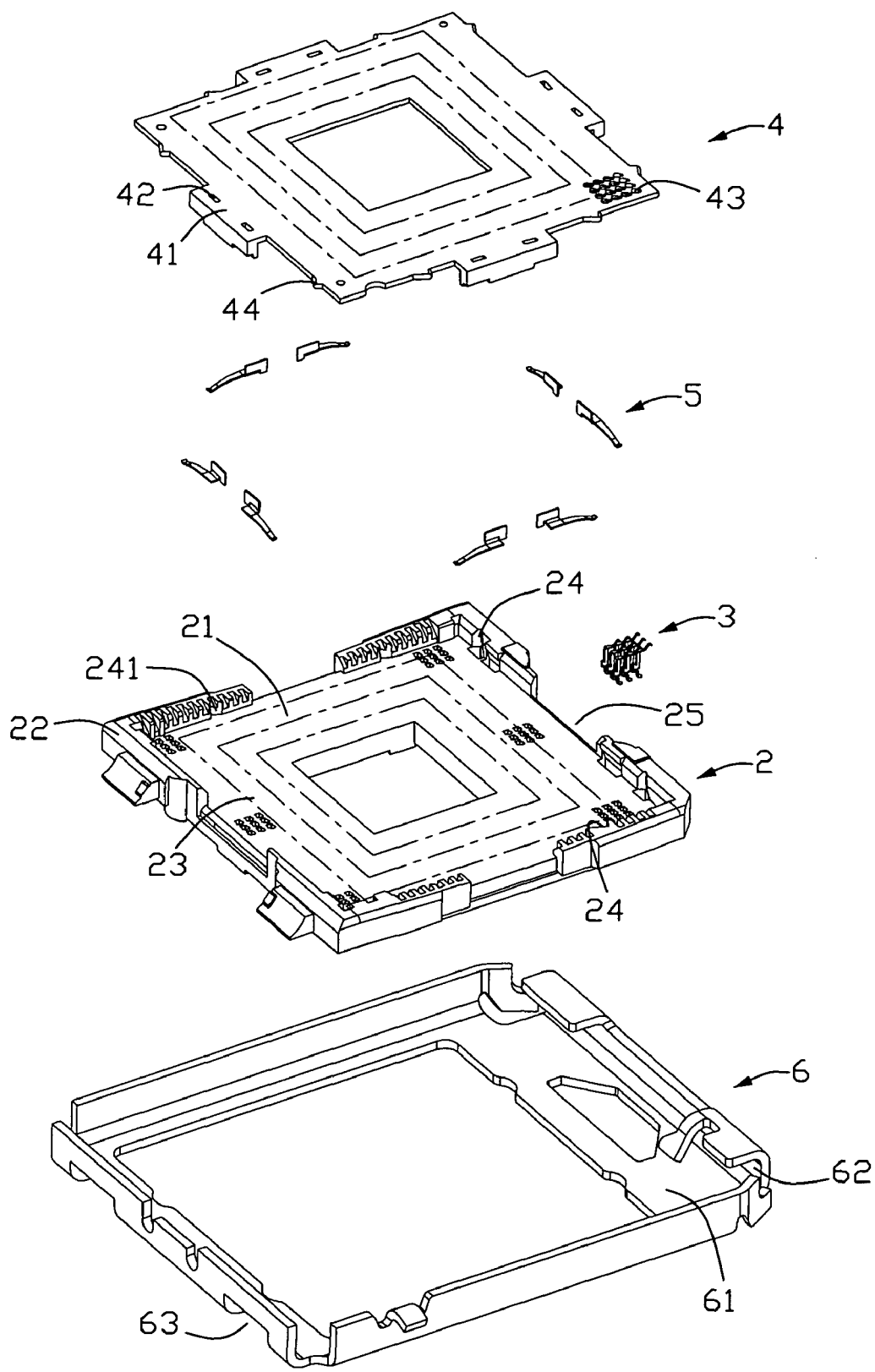
FIG. 1 is an exploded perspective view of an electrical connector assembly of the present invention.
Figure 2:
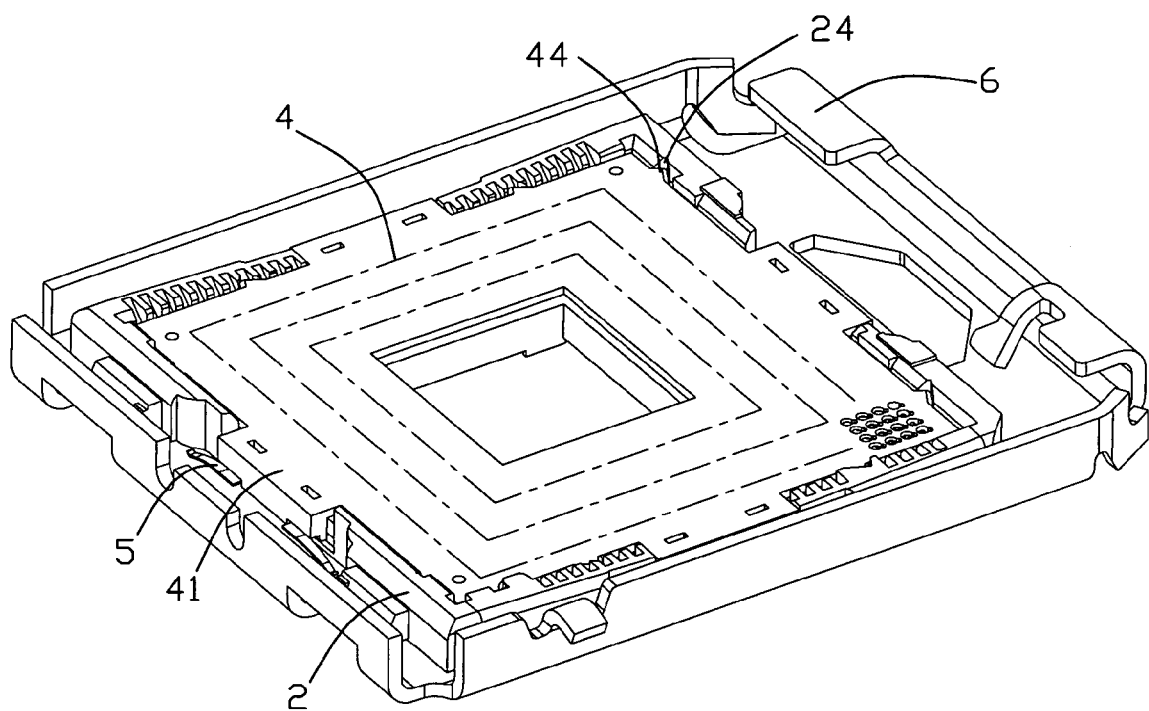
FIG. 2 is an assembled view of the electrical connector assembly shown in FIG. 1.
Figure 3:
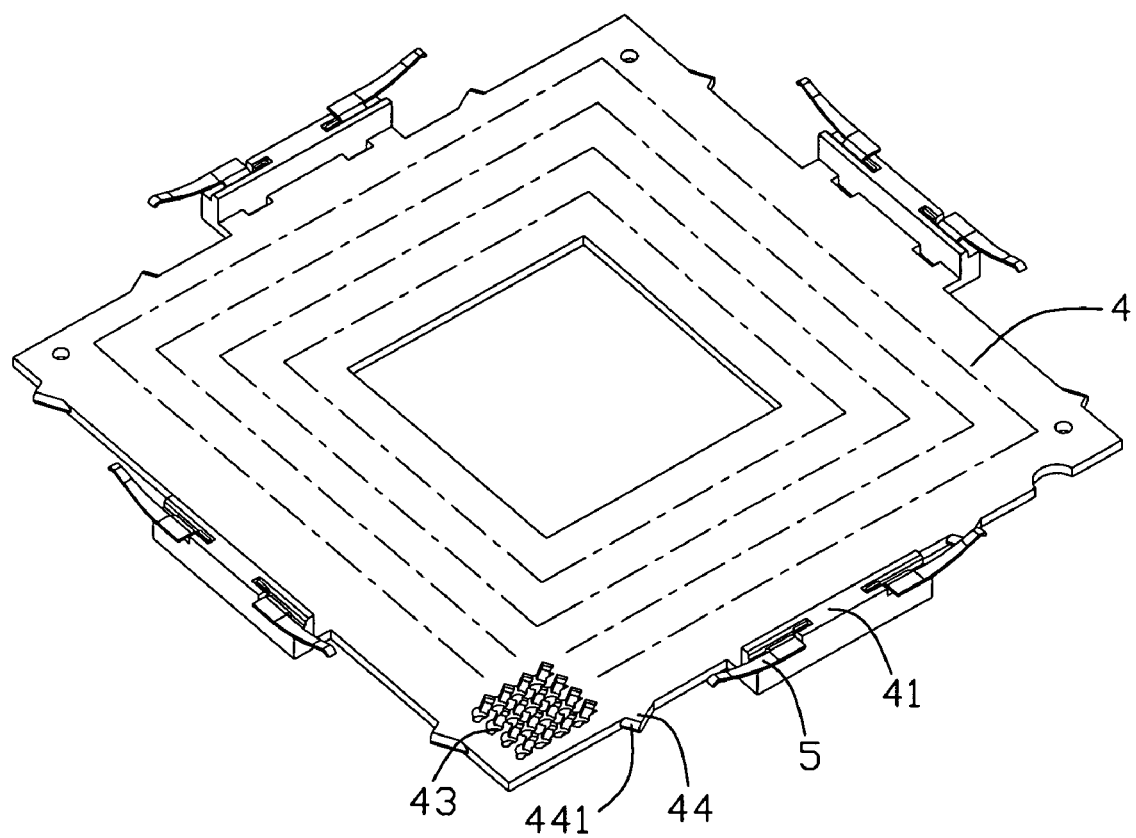
FIG. 3 is a bottom perspective view of the floating cover shown in FIG. 1.

Referring to FIG. 1 to FIG. 3, an electrical connector assembly of the present invention is used to connect an electronic package 7 and a printed circuit board (not shown). The electrical connector assembly comprises an insulative housing 2, a plurality of contacts 3 received in the insulative housing 2, a floating cover 4 moveably arranged respective to the insulative housing 2, and a fastening mechanism adapted to press the electronic package 7 toward the insulative housing 2.

The insulative housing 2 is substantially rectangular and molded from resin or the like. The insulative housing 2 includes a base 21 and a plurality of sidewalls 22 extending upwardly from the peripheral of the base 21. A cavity 23 is formed by the base 21 and the sidewalls 22 for receiving the electronic package 7. Each internal side of the sidewalls 22 has a number of guiding slots 24 for guiding the floating cover 4 to move up and down. The guiding slot 24 is substantially triangular. Each sidewall 22 forms a cutout 25 extending along an up to down direction and breaking up the sidewalls 22 at a middle portion thereof. The contact 3 has a mating portion 31 (see FIG. 7) for contacting with the electronic package 7. When the contacts 3 are assembled to the insulative housing 2, the mating portions 31 extend beyond a top surface of the base 21. The mating portion 31 defines a contact wiping direction which extends substantially parallel to the diagonal of the insulative housing 2.

The floating cover 4 is substantially rectangular and made of resin or the like. The floating cover 4 has four protruding portions 41 at the four sides thereof. Each protruding portion 41 forms two holes 42 to accommodate a spring element 5. The floating cover 4 defines a plurality of openings 43 corresponding to the contacts 3. Each opening 43 comprises a larger opening 431 and a smaller opening 432 (see FIG. 6) communicating with each other. The floating cover 4 has a plurality of guiding ribs 44 engaging with the guiding slots 24 of the insulative housing 2. The guiding slots 24 and the guiding ribs 44 each have a guiding surface 241, 441 parallel to the contact wiping direction adapted to guide the floating cover 4 moving along the contact wiping direction.

Figure 4:
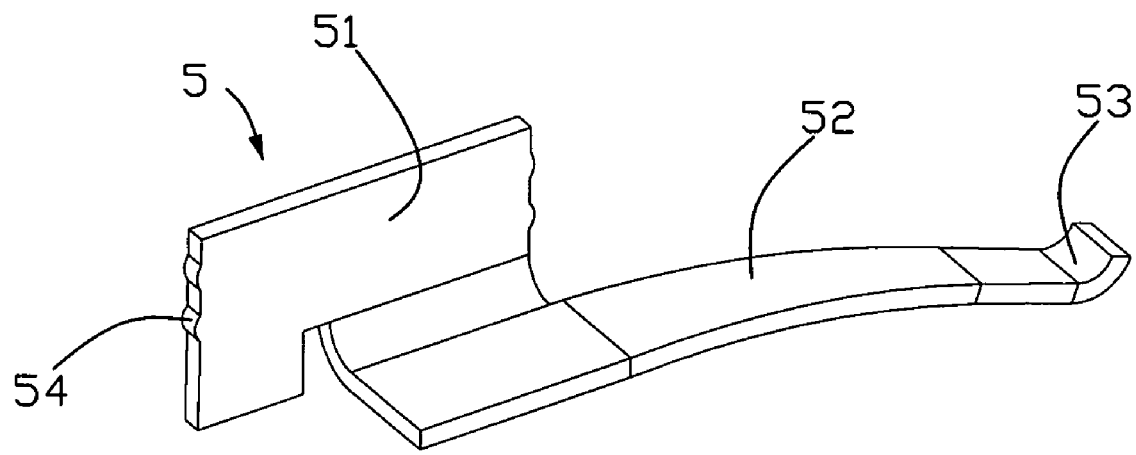
FIG. 4 is a perspective view of the spring element shown in FIG. 1.

Referring to FIG. 4, a plurality of metal spring elements 5 are positioned in the protruding portions 41 and each comprises a vertical retention portion 51 and a spring portion 52 bent from the retention portion 51. A curved portion 53 is formed at the free end of the spring portion 52 and projects downwardly on the floating cover 4. The retention portion 51 has barbs 54 at opposite sides thereof to engage with the protruding portion 41.

The fastening mechanism comprises a stiffener 6 surrounding the insulative housing 2, a load plate (not shown) and a lever (not shown). The stiffener 6 includes a planar frame 61. One end of the frame 61 forms a supporting portion 62 to pivotally mount the lever, and the other end of the frame 61 forms recesses 63 to pivotally mount the load plate.

Figure 5:
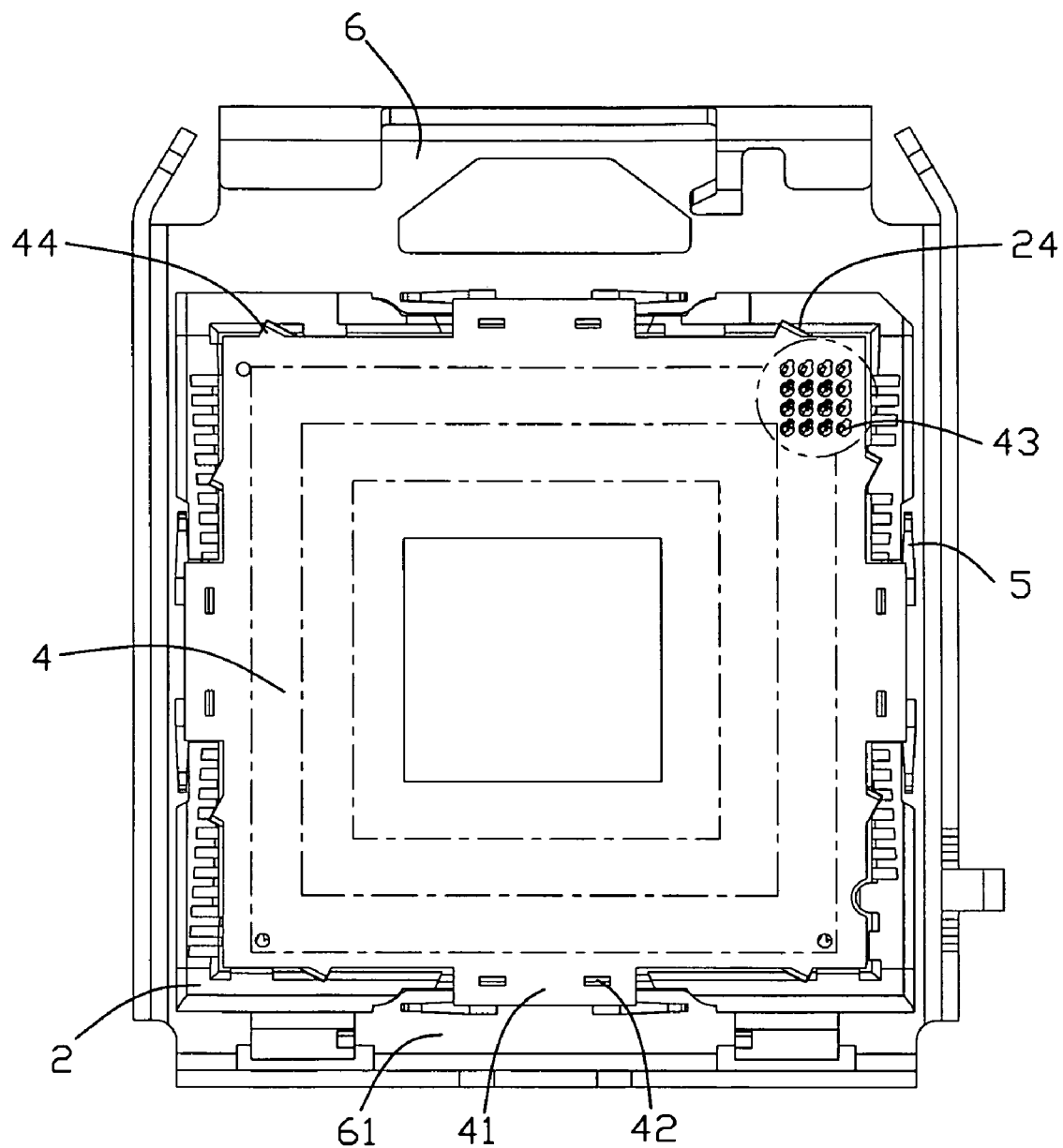
FIG. 5 is top view of the electrical connector assembly shown in FIG. 1.
Figure 6:
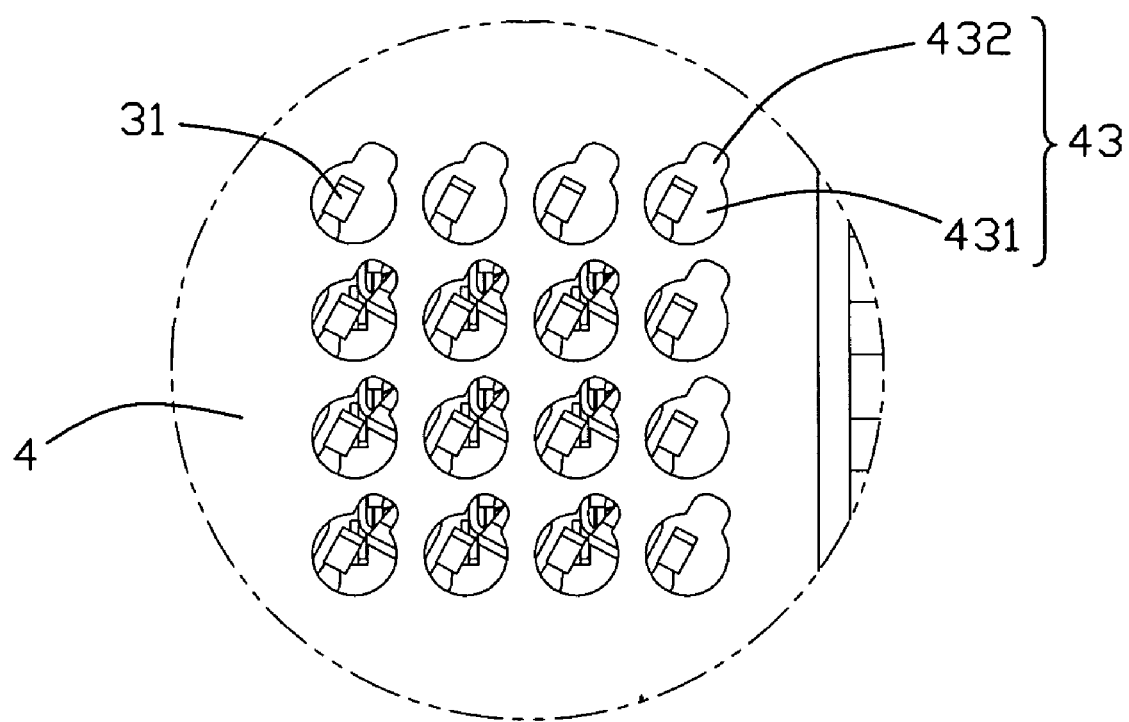
FIG. 6 is an enlarged view of the circle portion of FIG. 5.
Figure 7:
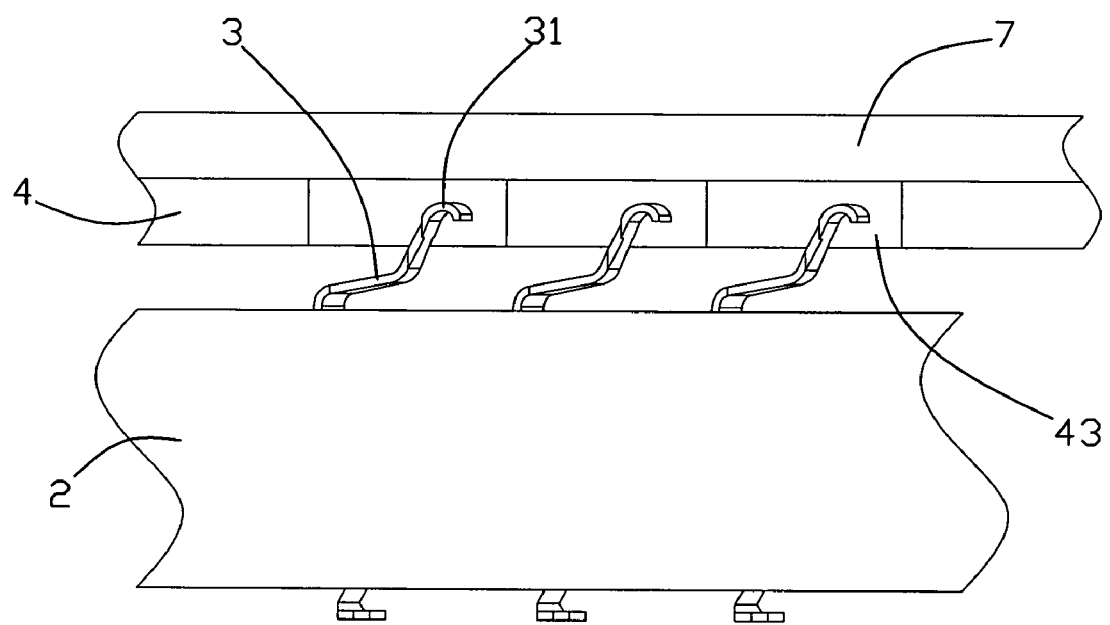
FIG. 7 is a side schematic view of the electrical connector assembly, showing the floating cover with electronic package at a first position.
Figure 8:
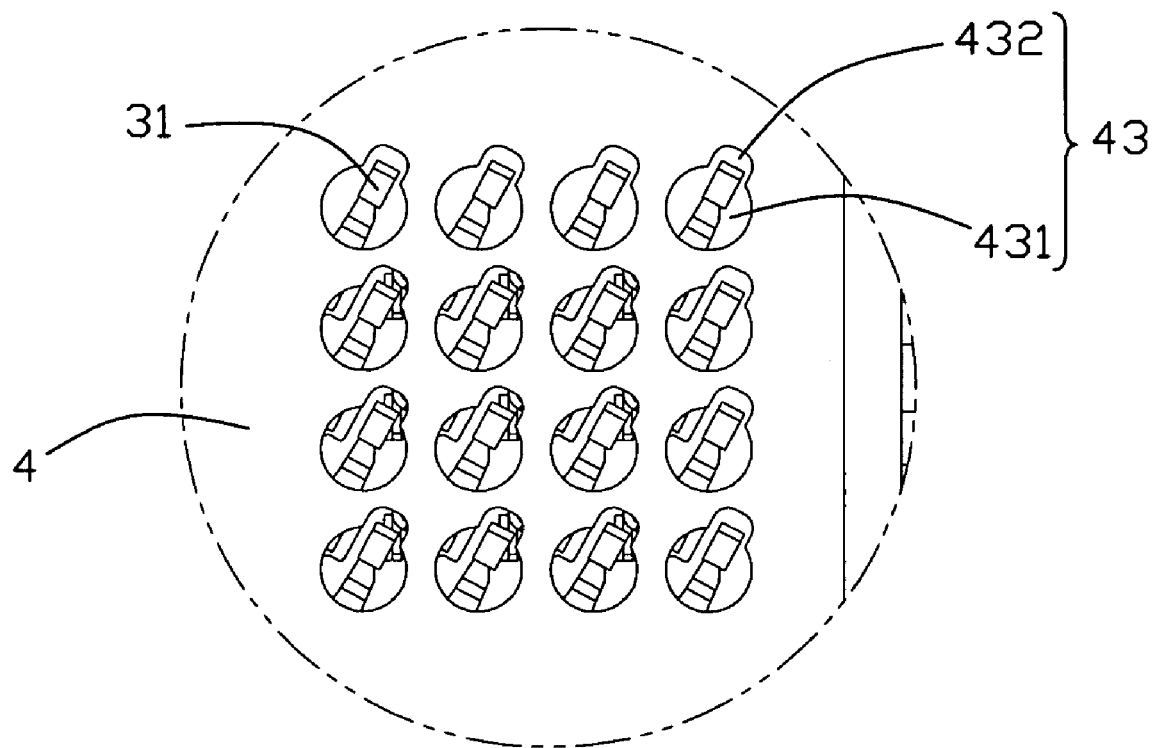
FIG. 8 is a top view of the electrical connector assembly, showing the contacts bending forward after the floating cover pushed to the top surface of the insulative housing.
Figure 9:
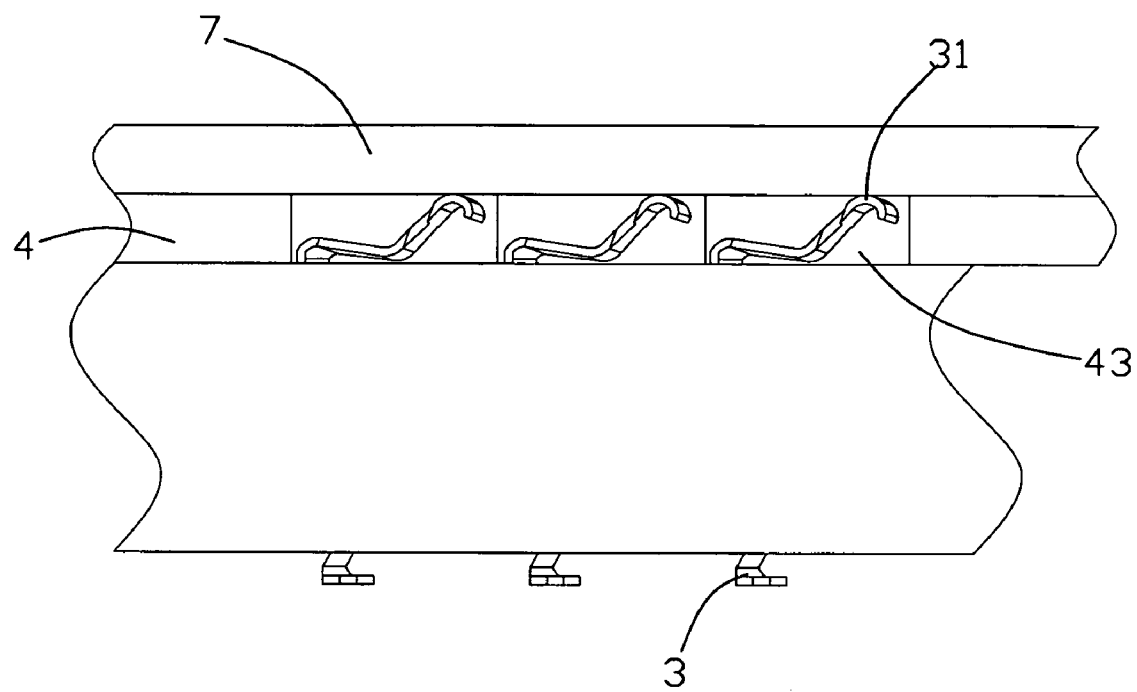
FIG. 9 is a side schematic view of the electrical connector assembly, showing the floating cover with electronic package at a second position.

The floating cover 4 can move relative to the stiffener 6 from a first position to a second position. FIG. 5 to FIG. 9 show a process of the floating cover 4 moving from the first position to the second position. FIG. 5 shows an assembly view of the electrical connector assembly without the electronic package 7. The insulative housing 2 with the contacts 3 is disposed in the frame 61 of the stiffener 6 and the mating portions 31 of the contacts 3 are received in the large openings 431 as shown in FIG. 6. The floating cover 4 covers the cavity 23 of the insulative housing 2. The spring elements 5 pass through the cutouts 25 of the insulative housing 2 and seat on the frame 61. Referring to FIG. 7, before the electronic package 7 is mounted to the connector assembly, the mating portions 31 of the contacts 3 are received in the larger openings 431. When the electronic package 7 is pressed downwardly, as shown in FIG. 8 and FIG. 9, the floating cover 4 is not only moved downwardly toward the insulative housing 2, but also slid forwardly along the contact wiping direction, until the mating portions 31 extend into the smaller openings 432 to avoid being damaged. At this time, the electronic package 7 presses the floating cover 4 contacting with the insulative housing 2 and the electronic package 7 is electrically connected with the contacts 3 at a top end of the floating cover 4. During the floating cover 4 moves from the first position to the second position, the mating portion 31 of the contact 3 is received in the opening 43 all the time without extending out of the floating cover 4.

In the present invention, the floating cover 4 can move in the vertical and the horizontal direction at the same time. Furthermore, the guiding slots 24 of the insulative housing 2 mate with the guiding ribs 44 for guiding the floating cover 4 in the contact wiping direction for avoiding interference between the contacts 3 and the floating cover 4.

Although the present invention has been described with reference to particular embodiments, it is not to be construed as being limited thereto. Various alterations and modifications can be made to the embodiments without in any way departing from the scope or spirit of the present invention as defined in the appended claims. For example, the cover may be still vertically spaced from the top face of the housing in the final stage, or the dimension of the opening of the cover in the extension direction is reduced while allowing the tip of the mating portion to extend through the opening at the initial stage under condition of the downward movement of the mating portion not interfering within the opening due to horizontal movement of the cover along with the vertical movement thereof to reach the final stage where the contact is fully mated with electronic package.

What is claimed is:

1. An electrical connector assembly comprising:
    an insulative housing including a base and a plurality of sidewalls extending upwardly from the peripheral of the base, at least a sidewall defining a guiding slot;
    a plurality of contacts received in the insulative housing and each having a mating portion projecting out of the insulative housing and extending along a contact wiping direction;
    a fastening mechanism surrounding the insulative housing; and
    a floating cover arranged on the fastening mechanism and moveable along an up and down direction, the floating cover defining a plurality of openings corresponding to the contacts, the floating cover having a guiding rib with a guiding surface to engage with guiding slot so as to slide along the contact wiping direction.

2. The electrical connector assembly as claimed in claim 1, wherein each opening of the floating cover has a larger opening and a smaller opening communicating with each other.

3. The electrical connector assembly as claimed in claim 1, wherein the floating cover comprises a plurality of guiding ribs protruding from edges of the floating cover corresponding to the guiding slots of the insulative housing, and each guiding slot has a guiding surface corresponding to the guiding surface of the guiding rib and parallel to the contact wiping direction.

4. The electrical connector assembly as claimed in claim 1, wherein the floating cover comprises a plurality of spring elements supported by the fastening mechanism.

5. The electrical connector assembly as claimed in claim 4, wherein the spring element comprises a vertical retention portion, a spring portion bent from the retention portion, and a curved portion disposed at a free end of the spring portion.

6. The electrical connector assembly as claimed in claim 1, wherein each sidewall of the insulative housing defines a cutout to break up the sidewalls.

7. The electrical connector assembly as claimed in claim 6, wherein the floating cover has a plurality of protruding portions at sides thereof, and the protruding portions are received in the cutout.

8. An electrical connector assembly for use with an electronic package, comprising:
    an insulative housing including a base and a plurality of sidewalls extending upwardly from the peripheral of the base;
    a plurality of contacts received in the insulative housing, each contact having a mating portion extending beyond top surface of the base;

a stiffener including a planar frame surrounding the insulative housing; and a floating cover moveably seated on the stiffener and defining a plurality of openings for receiving the mating portions of the contacts, the floating cover synchronously moving in a vertical direction and a horizontal direction relative to the insulative housing from a first position to a second position.

9. The electrical connector assembly as claimed in claim 8, wherein each sidewall of the insulative housing forms a cutout and the floating cover has a protruding portion received in the cutout for securing the spring element.

10. The electrical connector assembly as claimed in claim 8, wherein each opening of the floating cover has a larger opening and a smaller opening, and the mating portion of the contact moves from the larger opening to the smaller opening when the floating cover moves from the first position to the second position.

11. The electrical connector assembly as claimed in claim 8, wherein the floating cover includes a plurality of guiding ribs and the sidewalls of the insulative housing defines a plurality of guiding slots corresponding to the guiding ribs to lead the floating cover sliding in the horizontal direction.

12. The electrical connector assembly as claimed in claim 8, wherein during the floating cover moves from the first position to the second position, the mating portion of the contact is received in the opening and not extends out of the top end of floating cover.

13. The electrical connector assembly as claimed in claim 8, wherein the floating cover comprises a plurality of spring elements secured thereon and supported by the stiffener.

14. The electrical connector assembly as claimed in claim 13, wherein the spring element comprises a vertical retention portion, a spring portion bent from the retention portion, and a curved portion at free end of the spring portion.

15. An electrical connector comprising:
an insulative housing;
a plurality of contacts disposed in the housing with mating sections upwardly extending above a top face of the housing;
a floating insulative cover positioned upon the housing and back and forth moveable in both vertical and horizontal directions with regard to the housing during operation, said cover defining a plurality of through holes into which upper sections of the mating sections of the corresponding contacts extend, respectively; wherein
the housing is equipped with a plurality of first guiding structures circumferentially above the top face, and the cover is equipped with a plurality of second guiding structures engaged with the corresponding first guiding structures for guiding movement of the cover in both the vertical direction and the horizontal direction.

16. The electrical connector as claimed in claim 15, wherein the mating section extends in an oblique direction, in a top view, which is same as the horizontal direction the cover moves.

17. The electrical connector as claimed in claim 15, wherein said first guiding structures face inwardly while second guiding structures facing outwardly.

18. The electrical connector as claimed in claim 15, wherein said cover is seated upon the top face of the housing in a final fully operated status.

19. The electrical connector as claimed in claim 15, further including a plurality of springs located between the housing and the cover to urge the cover to upwardly move away from the housing.

* * * * *